United States Patent
Akour et al.

(10) Patent No.: US 11,296,691 B2
(45) Date of Patent: *Apr. 5, 2022

(54) POWER-ON RESET CIRCUIT WITH RESET TRANSITION DELAY

(71) Applicant: TEXAS INSTRUMENTS INCORPORATED, Dallas, TX (US)

(72) Inventors: Amneh Mohammad Akour, Richardson, TX (US); Nikolaus Klemmer, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/867,392

(22) Filed: May 5, 2020

(65) Prior Publication Data

US 2020/0266814 A1    Aug. 20, 2020

Related U.S. Application Data

(63) Continuation of application No. 15/299,458, filed on Oct. 20, 2016, now Pat. No. 10,644,693.

(Continued)

(51) Int. Cl.
*H03K 17/22*    (2006.01)
*G06F 1/24*    (2006.01)

(52) U.S. Cl.
CPC ............ *H03K 17/223* (2013.01); *G06F 1/24* (2013.01)

(58) Field of Classification Search
CPC ...... H03K 17/22; H03K 17/223; H03K 17/30; H03K 3/02337; H03K 5/08; G06F 1/24; G01R 19/16519
See application file for complete search history.

(56) References Cited

U.S. PATENT DOCUMENTS 8,035,428 B2    10/2011 Kang
10,644,693 B2 *  5/2020 Akour .................. H03K 17/223
(Continued)

OTHER PUBLICATIONS

Hodges et al., Analysis and Design of Digital Integrated Circuits, 1988, McGraw-Hill, Inc., second edition, pp. 23-29.*

*Primary Examiner* — Long Nguyen
(74) *Attorney, Agent, or Firm* — Ray A. King; Charles A. Brill; Frank D. Cimino

(57) ABSTRACT

A power-on-reset (POR) circuit for CMOS logic is operable to transition between a POR_active state and a POR_inactive state and can include: (a) VDD/VT threshold circuitry to provide a Vtp_threshold voltage based on input Vdd and PMOS Vtp, and a Vtn_threshold voltage based on input Vdd and NMOS Vtn; (b) POR transition detect circuitry to provide a POR_transition signal (active/inactive) based on a function (Vtp, Vtn), which is a function of Vtp_threshold and Vtn_threshold; and (c) POR transition control circuitry to provide the POR_state signal (active/inactive) based on the POR_transition signal. For a POR out-of-reset transition, the POR transition detect circuitry to switch the POR_transition signal inactive based on the function (Vtp, Vtn) corresponding to the POR_inactive state, and the POR transition control circuitry, responsive to the POR_transition signal switching to inactive, to initiate a POR out-of-reset delay period, and to signal the POR_inactive state after the POR out-of-reset delay period.

14 Claims, 3 Drawing Sheets

Related U.S. Application Data

(60) Provisional application No. 62/243,913, filed on Oct. 20, 2015.

(56) References Cited

U.S. PATENT DOCUMENTS

| | | | |
|---|---|---|---|
| 2005/0140405 A1* | 6/2005 | Do | H03K 17/223 |
| | | | 327/143 |
| 2005/0275437 A1 | 12/2005 | Suzuki et al. | |
| 2006/0103437 A1 | 5/2006 | Kang | |
| 2006/0103438 A1 | 5/2006 | Kang | |
| 2009/0160505 A1 | 6/2009 | Rho | |
| 2010/0315133 A1 | 12/2010 | Kang | |
| 2012/0126864 A1* | 5/2012 | Daigle | H03K 17/223 |
| | | | 327/143 |
| 2016/0072480 A1* | 3/2016 | Coutts | H03K 19/0008 |
| | | | 326/46 |

\* cited by examiner

POWER-ON RESET CIRCUIT WITH RESET TRANSITION DELAY

CROSS-REFERENCE TO RELATED APPLICATIONS

This application is a continuation of U.S. patent application Ser. No. 15/299,458, filed Oct. 20, 2016, which was issued as U.S. Pat. No. 10,644,693 on May 5, 2020, which Priority is claimed under 37 CFR 1.78 and 35 USC 119(e) to U.S. Provisional Application No. 62/243,913 filed Oct. 20, 2015, the contents of which are herein incorporated by reference in its entirety.

BACKGROUND

Power-on reset (POR) circuits are incorporated into integrated circuits to set the IC to a known state at power-up and power-down (or power interruption). POR circuits transition the IC between a reset state with POR active, and an operational state with POR inactive.

For power-up, the POR circuit transitions out-of-reset when supplied power (Vdd) has ramped enough to support stable register operation. When the POR circuit transitions out-of-reset, registers in the digital domain are set to their desired state for operation.

For power-down, the POR circuit transitions into-reset when supplied power (VDD) drops below a safe voltage to retain register values. When the POR circuit transitions into-reset, all registers are reset to a default state.

BRIEF SUMMARY

This Brief Summary is provided as a general introduction to the Disclosure provided by the Detailed Description and Drawings, summarizing aspects and features of the Disclosure. It is not a complete overview of the Disclosure, and should not be interpreted as identifying key elements or features of, or otherwise characterizing or delimiting the scope of, the disclosed invention.

The Disclosure describes apparatus and methods for power-on reset (POR) with reset transition based on transistor Vt. A POR circuit according to this Disclosure is suitable for use in an integrated circuit including at least one CMOS logic block that includes PMOS and NMOS transistors respectively characterized by threshold voltages Vtp and Vtn, the CMOS circuitry operable with a power supply voltage Vdd. The POR circuit is operable to transition between a POR_active state and a POR_inactive state, including outputting a corresponding POR_state signal.

According to aspects of the Disclosure, the POR circuit can include: (a) VDD/VT threshold circuitry coupled to receive the Vdd voltage as an input to the POR circuit, and to provide a Vtp_threshold voltage based on Vdd and Vtp, and a Vtn_threshold voltage based on Vdd and Vtn; (b) POR transition detect circuitry coupled to the VDD/VT threshold circuitry to provide a POR_transition signal based on a function (Vtp, Vtn), which is a function of Vtp_threshold and Vtn_threshold; and (c) POR transition control circuitry coupled to the POR transition detect circuitry to provide the POR_state signal based on the POR_transition signal. For a POR out-of-reset transition of the POR_state signal from POR_active to POR_inactive, the POR transition detect circuitry is operable to switch the POR_transition signal from active to inactive based on the function (Vtp, Vtn) corresponding to the POR_inactive state, and the POR transition control circuitry is operable, in response to the POR_transition signal switching to inactive, to initiate a POR out-of-reset delay period, and to generate the POR_inactive signal after the POR out-of-reset delay period.

Other aspects and features of the invention claimed in this Patent Document will be apparent to those skilled in the art from the following Disclosure.

DETAILED DESCRIPTION

This Description and the Drawings constitute a Disclosure for power-on reset with reset transitions based on transistor Vt, including describing examples, and various technical features and advantages.

Figure 1:
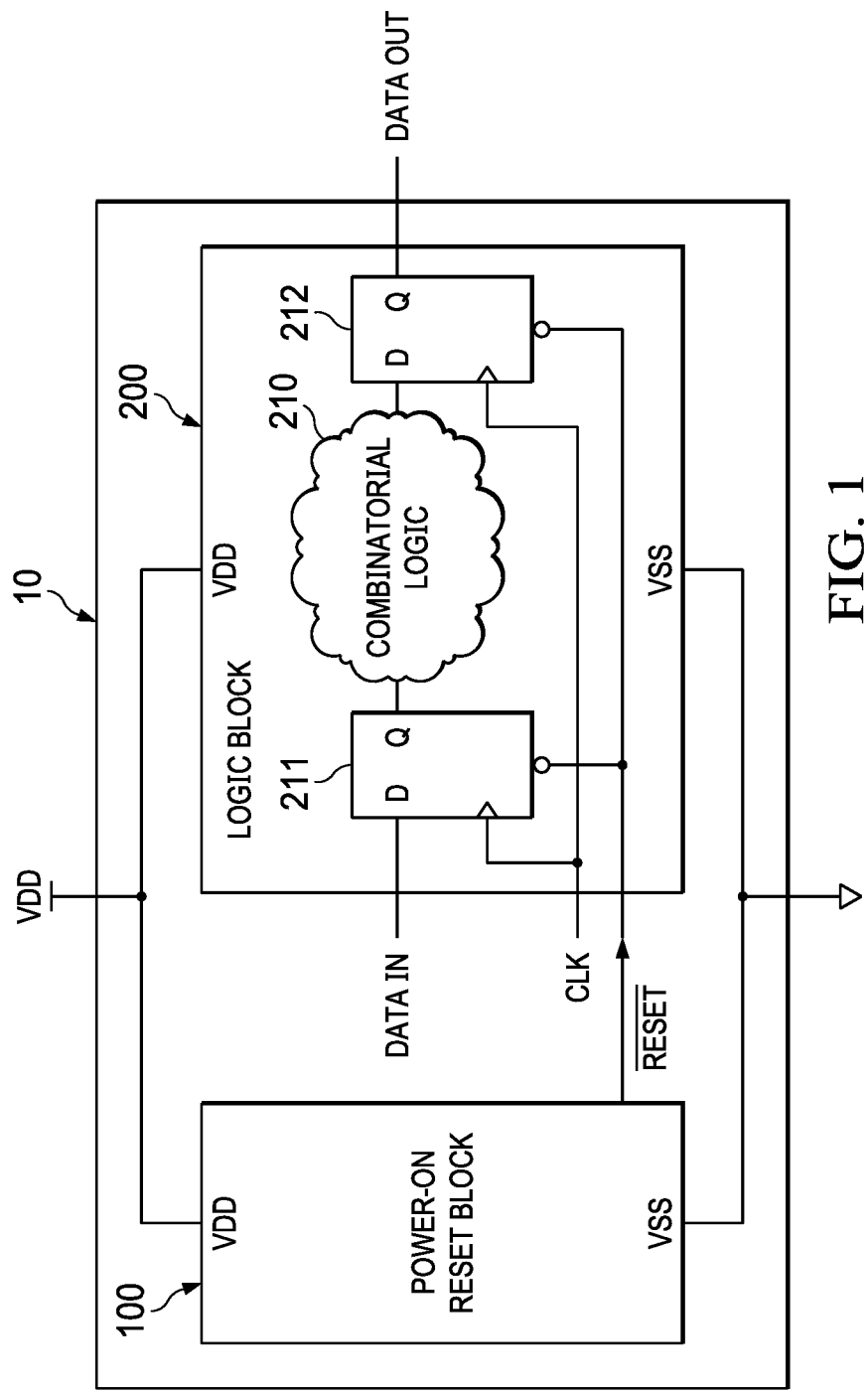
FIG. 1 illustrates a an example integrated circuit (10) including a power-on reset (POR) circuit (100) providing power on reset for IC logic circuitry represented by a logic block (200).

In brief overview, a power-on-reset (POR) circuit is suitable for use in an integrated circuit including at least one CMOS logic block that includes PMOS and NMOS transistors respectively characterized by threshold voltages Vtp and Vtn, the CMOS circuitry operable with a power supply voltage Vdd. The POR circuit is operable to transition between a POR_active state and a POR_inactive state, including outputting a corresponding POR_state signal. The POR circuit includes: (a) VDD/VT threshold circuitry coupled to receive the Vdd voltage as an input to the POR circuit, and to provide a Vtp_threshold voltage based on Vdd and Vtp, and a Vtn_threshold voltage based on Vdd and Vtn; (b) POR transition detect circuitry coupled to the VDD/VT threshold circuitry to provide a POR_transition signal based on a function (Vtp, Vtn), which is a function of Vtp_threshold and Vtn_threshold; and (c) POR transition control circuitry coupled to the POR transition detect circuitry to provide the POR_state signal based on the POR_transition signal. For a POR out-of-reset transition of the POR_state signal from POR_active to POR_inactive, the POR transition detect circuitry is operable to switch the POR_transition signal from active to inactive based on the function (Vtp, Vtn) corresponding to the POR_inactive state, and the POR transition control circuitry is operable, in response to the POR_transition signal switching to inactive, to initiate a POR out-of-reset delay period, and to generate the POR_inactive signal after the POR out-of-reset delay period FIG. 1 illustrates an example CMOS integrated circuit 10, including a power-on reset (POR) circuit 100. POR 100 provides power-on reset for IC logic circuitry, represented by a CMOS logic block 200.

The CMOS logic 200 includes PMOS and NMOS transistors respectively characterized by threshold voltages Vtp and Vtn. Power supplied to IC 10 is represented by a Vdd supply voltage, with Vss at ground.

Logic block 200 includes combinational (combinatorial) logic 210, with input and output clocked latches (D flip-flops) 211, 212. The D flip-flops represent latches/registers that are reset by POR 100.

POR 100 outputs a/RESET POR state signal that controls the POR reset state of the CMOS logic in logic block 200. As illustrated, D flip-flops 211/212 include a/RESET input provided by the POR 100.

By convention, the POR/RESET output is active-low (POR=0), so that for as long as POR=0, latches/registers are held in the POR_active (reset) state. When the POR circuit 100 transitions to POR_inactive (POR=1), digital logic is stable and operational.

POR circuits can be implemented with a fixed supply voltage (such as bandgap-referenced) to generate thresholds for reset transitions. This approach requires a transition timing margin to account for variations in process and temperature.

POR 100 implements reset transitions based on transistor Vt to track process and temperature variations in the stable, required operating voltage for the IC latches/registers (logic block 200). That is, Vtn and Vtp are process/temperature dependent parameters. POR 100 implements a minimum-duration reset pulse width, independent of the slew rate of the VDD ramp.

Figure 2:
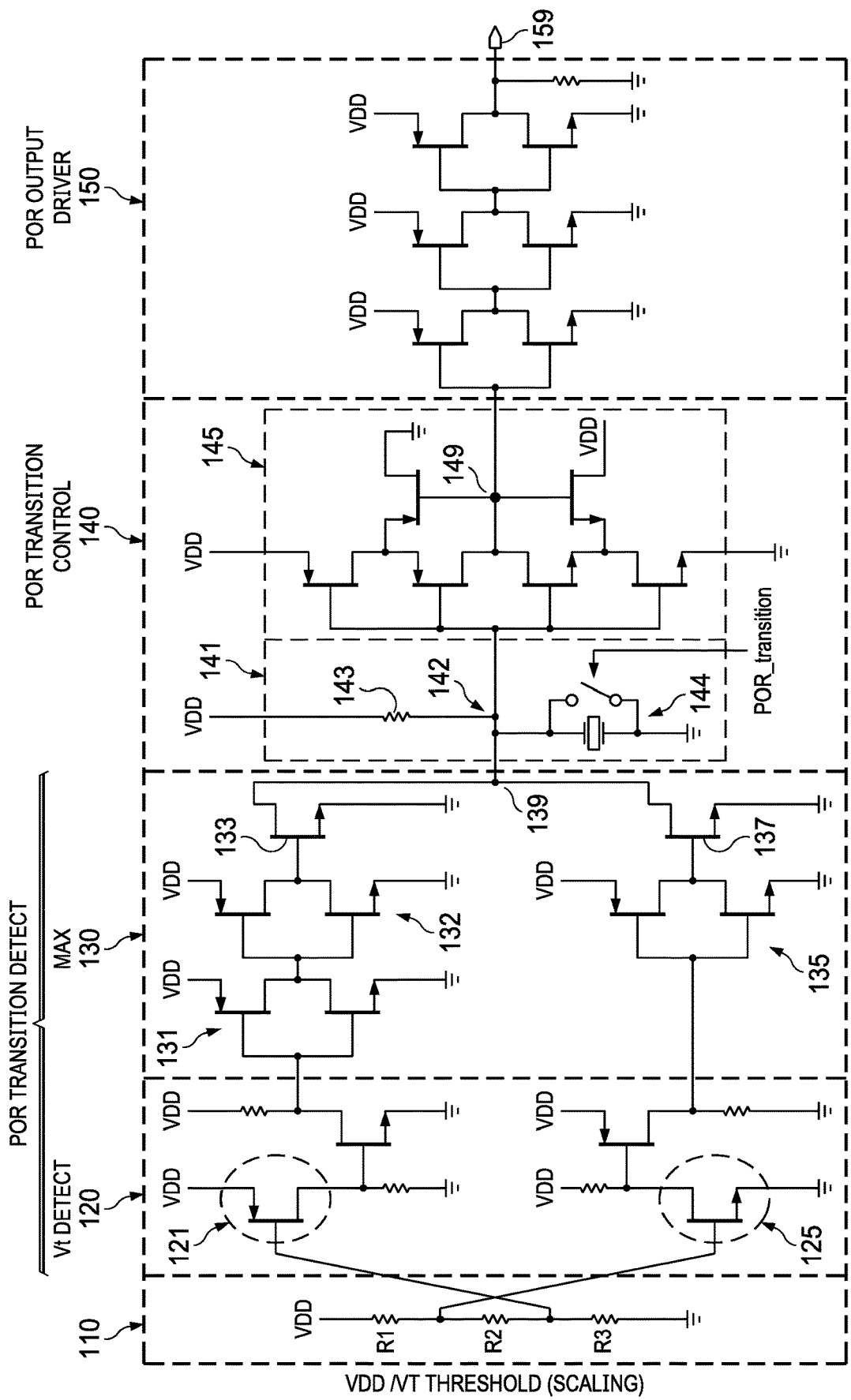
FIG. 2 illustrates an example POR circuit in which reset transitions are based on transistor Vt, the POR circuit including: VDD/VT threshold circuitry (110); POR transition detect circuitry (120/130); POR transition control circuitry (140); and POR output driver circuitry (150).

FIG. 2 illustrates an example POR circuit 100 in which reset transitions are based on transistor Vt according to this Disclosure. POR 100 includes: VDD/VT threshold circuitry 110; POR transition detect circuitry 120/130; POR transition control circuitry 140; and POR output driver circuitry 150.

The POR circuitry is operable to transition between a POR_active state (POR=0), and a POR_inactive state (POR=1), including outputting the corresponding POR_state signal/RESET.

VDD/VT threshold circuitry 110 is coupled to receive the Vdd voltage as an input. VDD/VT threshold circuitry 110 provides a self-referenced Vtp_threshold voltage based on Vdd and Vtp, and a self-referenced Vtn_threshold voltage based on Vdd and Vtn.

For the example implementation, VDD/VT threshold circuitry provides the Vtp_threshold and Vtn_threshold voltages based on scaling input Vdd voltage (effectively, scaling Vtp and Vtn). Scaling is implemented as a resistive voltage divider, series R1, R2, R3. The Vtp_threshold voltage corresponds to a voltage at a node between R2 and R3

$$Vtp\left(\frac{\sum R}{R2+R3}\right),$$

and the Vtn_threshold voltage corresponds to a voltage at a node between R1 and R2

$$Vtn\left(\frac{\sum R}{R1+R2}\right).$$

That is, VDD/VT threshold circuitry 110 sets the trigger thresholds for POR reset transitions in proportion to the threshold voltages Vtp_threshold, Vtn_threshold of the CMOS logic transistors (logic block 200), i.e., scaled Vtp, Vtn. In this way, safe trigger thresholds are obtained across the temperature and manufacturing process tolerance windows.

POR transition detect circuitry 120/130 is coupled to the VDD/VT threshold circuitry 110 to provide a POR_transition signal based on a function (Vtp, Vtn). Function(Vtp, Vtn) is a function of the Vtp_threshold and Vtn_threshold voltages (scaled Vtp, Vtn). For the example implementation the function (Vtp, Vtn) is a scaled max function: k*max (Vtp, Vtn), where k is a scaling factor of 1 or more.

For the example implementation, POR transition detect circuitry 120/130 includes Vt detect circuitry 120 and max circuitry 130. Vt detector 120 includes a replica PMOS transistor 121 controlled by the Vtp_threshold voltage, and a replica NMOS transistor 125 controlled by the Vtn_threshold voltage.

Max circuitry 130 implements the example scaled max function k*max(Vtp, Vtn) to provide a POR_transition signal. Max circuitry 130 is coupled to the replica PMOS transistor 121 and the replica NMOS transistor 125 in the Vt detector 120, which detect the Vtp_threshold and Vtn_threshold voltages (scaled Vtp, Vtn). The detected Vtp_threshold voltage is applied (through inverters 131, 132) to the control input of NMOS transistor 133, and the detected Vtn_threshold voltage is applied (through inverter 135) to the control input to NMOS transistor 137.

The NMOS transistors 133, 137 are coupled between a common node 139 and ground. If both NMOS transistors 133, 137 are off, the common node is decoupled from ground, and if at least one of the NMOS transistors 133, 137 is on, the common node is coupled to ground. The POR_transition signal is operable, when active, to short the common node to ground, and when inactive to decouple the common node from ground.

The scaled Vdd trigger thresholds (scaled Vtp, Vtn) are applied to the Vt detector. The Vt detector cell outputs transition when $$Vdd, n-thr \geq Vtn\left(\frac{\sum R}{R1+R2}\right), \text{ and } Vdd, p-thr \geq Vtp\left(\frac{\sum R}{R2+R3}\right)$$

In response, max circuitry 130 provides the POR_transition signal at the common node 139 based on the example max function: k*max (Vtp, Vtn).

POR transition control circuitry 140 is coupled to the POR transition detect circuitry 120/130 to provide the POR_state signal based on the POR_transition signal.

For the example implementation, the POR transition control circuitry 140 is implemented as an RC delay cell 141. POR transition control circuitry 140 includes an RC delay circuit 141 with an RC input node 142 coupled to the common node. RC delay circuit 141 includes a resistor Rcharge 143 and a delay capacitor 144. Rcharge 143 is coupled between the Vdd charging voltage and the RC input node 142, and delay capacitor 144 is coupled between the RC input node 142 and ground. The POR_transition signal is operable, when active, to short the common node 139 and the RC input node to ground, and when inactive to decouple the common node 139 and the RC input node from ground. A Schmitt trigger 145 with an input coupled to the RC input node provides the POR_state signal at node 149.

Thus, for larger Vdd>(Vtn, Vtp), the CMOS logic (FIG. 1, 200) is operational, and max logic holds delay cap 144 in a discharge state, and the POR_state signal/RESET is active-low (reset state). When Vdd>[Vdd,n-thr and Vdd,p-thr], the hold on the delay cell 141 charging is released.

POR output driver circuitry 150 is coupled to the POR transition control circuitry to drive the POR_state signal out from a POR output 159. POR output driver circuitry 150 includes a pull-down resistor 155 coupled to the POR output 159.

For a POR out-of-reset transition of the POR_state signal from POR_active to POR_inactive, the POR transition detect circuitry 120/130 is operable to switch the POR_transition signal from active to inactive based on the function (Vtp, Vtn) corresponding to the POR_inactive state. The POR transition control circuitry 120/130 is operable, in response to the POR_transition signal switching to inactive, to initiate a POR out-of-reset delay period, and to generate the POR_inactive signal after the POR out-of-reset delay period. An example duration for the POR out-of-reset delay period is a few microseconds.

Note that, for the example scaled max function k*max (Vtp, Vtn), if the scale factor is selected to be 1, then the Vtp_threshold=Vtp and Vtn_threshold=Vtn, and out-of-reset is determined by the POR out-of-reset delay period.

For a POR into-reset transition of the POR_state signal from POR_inactive to POR_active (reset), the POR transition detect circuitry 120/130 is operable to switch the POR_transition signal from inactive to active based on the function (Vtp, Vtn) corresponding to the POR_active state. The POR transition control circuitry 120/130 is operable, in response to the POR_transition signal switching to active, to switch the POR_state signal from POR_inactive to POR_active with an into-reset transition that is substantially less than the POR out-of-reset delay period.

That is, the function of the POR circuit 110 is as follows. During power-on (rising supply voltage), the POR output/RESET is active (logic zero). After the POR delay period (for example, a few microseconds) after the supply voltage Vdd has passed through the self-referenced scaled threshold voltages Vtp_threshold and Vtn_threshold, the POR circuit output becomes inactive (POR level changes to 1), which releases the registers in the logic block from the reset state. The example microsecond delay will be enough for the registers to assume their desired, initial reset state. For power-off (or brown-out), when VDD falls below the self-referenced scaled threshold, POR output returns to active (logic 0) with a transition period significantly less than the delay period (Ron<<Rcharge), since the registers will lose their state for VDD less than that value.

For POR transitions out-of-reset, note that static CMOS gates become operational (albeit slow) when Vdd≥max(Vtn, Vtp), and operate substantially at full speed when Vdd=Vtn+Vtp. A short delay based on the scaled threshold voltages Vtp_threshold and Vtn_threshold (i.e., the scaled max function k*max(Vtp, Vtn)) can be designed such that even if the supply turns on without delay there will still be enough time for the registers to assume their desired state before the POR output transitions from active (0) to inactive (1). For POR transitions into-reset, when Vdd falls below the threshold voltages Vtp_threshold, Vtn_threshold, the POR/RESET output should return to reset-active (0) without significant delay.

Thus, for POR transitions out-of-reset, for small Vdd<(Vtn, Vtp), all devices are off, and output is in soft pull-down. An RC-delay time constant later (for example, a few microseconds) determined by the POR transition control circuitry 140, the output transitions high, and the POR circuit releases reset on connected registers.

For POR transitions into reset, when VDD<VDD,n-thr or VDD<VDD,p-thr, the Vt detector transitions with short delay. The max logic 130 discharges the delay cell capacitor 144 quickly (Ron<<Rcharge), and the POR/RESET output transitions low into reset.

Figure 3:
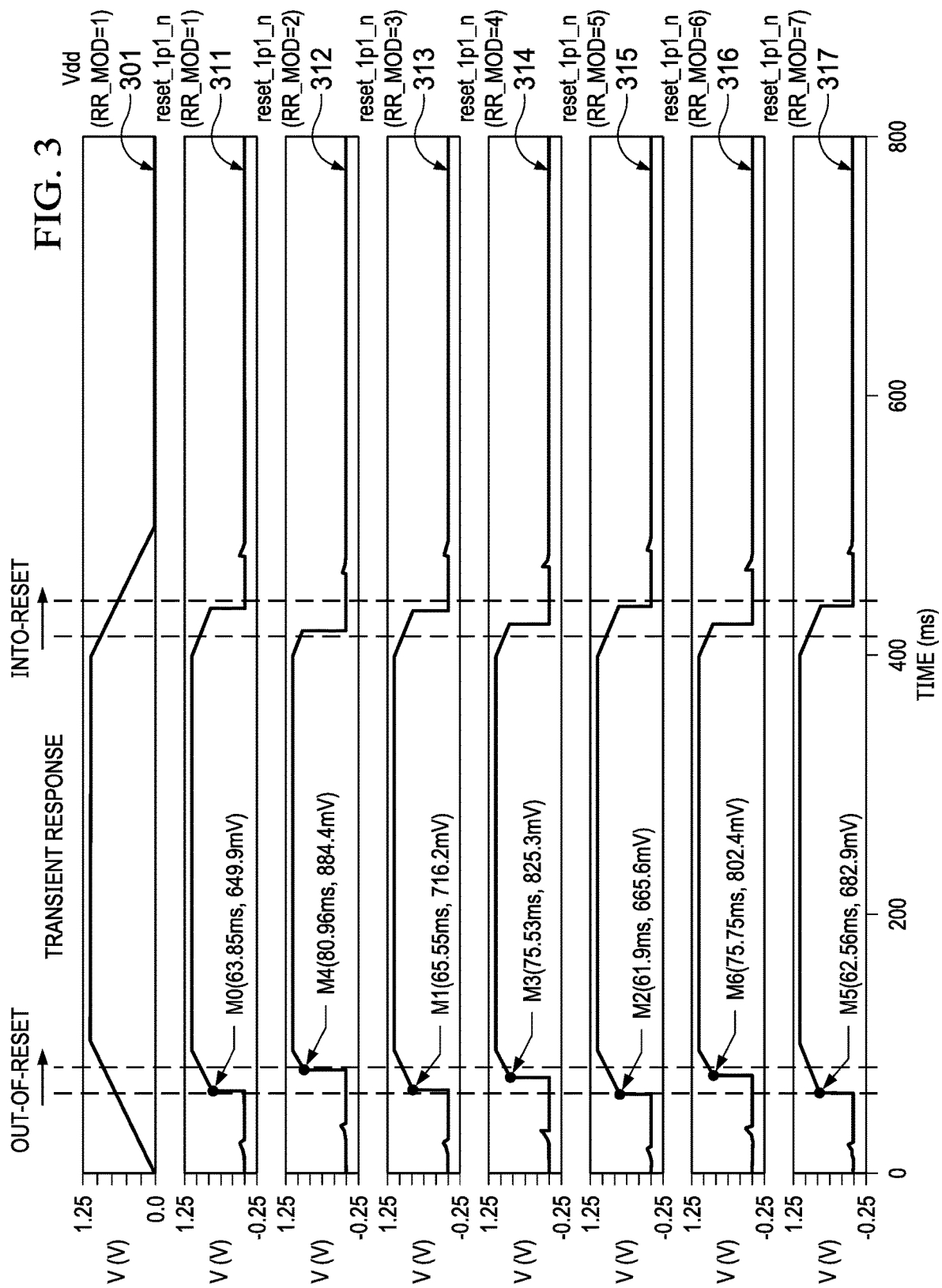
FIG. 3 provides example plots illustrating POR transitions out-of-reset and into-reset for example process/temperature conditions.

FIG. 3 provides example plots illustrating POR transitions out-of-reset and into-reset for example process/temperature conditions 311-317 in response to Vdd power-on/off 301.

According to aspects of the Disclosure, the threshold voltage is not a fixed value or a value that needs to be recalculated from process to process and over temperature. The threshold voltage is determined based on the process and is proportional to (Vtn,Vtp). The POR circuit tracks process and temperature variations in the required operating supply voltage for the CMOS logic latches/registers. The POR circuit implements a minimum-duration reset pulse width, independent of the slew rate of the VDD ramp.

The Disclosure provided by this Description and the Figures sets forth example implementations and applications illustrating aspects and features of the invention, and does not limit the scope of the invention, which is defined by the claims. Known circuits, functions and operations are not described in detail to avoid obscuring the principles and features of the invention. These example implementations and applications, including example design considerations/choices/tradeoffs, can be used by ordinarily skilled artisans as a basis for modifications, substitutions and alternatives to construct other designs, including adaptations for other applications.

The invention claimed is:

1. A power-on-reset (POR) circuit comprising:
   a PMOS transistor having a first drain, a first source and a first gate, the first drain coupled to a power supply terminal, the PMOS transistor having a threshold voltage Vtp;
   a first NMOS transistor having a second drain, a second source and a second gate, the second source coupled to a ground terminal, the first NMOS transistor having a threshold voltage Vtn;
   a first resistor coupled between the power supply terminal and the second gate;
   a second resistor coupled between the first gate and the second gate; and
   a third resistor coupled between the first gate and the ground terminal;
   a POR transition detect circuit having:
      first and second transition detect inputs and a transition detect output, the first transition detect input coupled to the first source, the second transition detect input coupled to the second drain, and the transition detect output configured to provide a POR_transition signal responsive to a Vtp_threshold voltage at the first gate, and to a Vtn_threshold voltage at the second gate;
      a second NMOS transistor coupled between the transition detect output and the ground terminal, controlled responsive to the Vtp_threshold voltage; and
      a third NMOS transistor coupled between the transition detect output and the ground terminal, controlled responsive to the Vtn_threshold voltage;
   a POR transition control circuit having:
      a transition control input coupled to the transition detect output;
      an RC delay circuit having a delay input coupled to the transition detect output, the RC delay circuit including:
         a charge resistor coupled between the power supply terminal and the delay input;
         a capacitor coupled between the delay input and the ground terminal; and
         a Schmitt trigger having a trigger input and a trigger output, the trigger input coupled to the delay input; and
      a transition control output coupled to the trigger output and configured to provide a POR_state signal responsive to the POR_transition signal, wherein the POR_state signal has a value of either POR_active or POR_inactive; and a POR output driver circuit having a driver input and a driver output, the driver input coupled to the transition control output, and the driver output configured to provide a POR_out signal.

2. The circuit of claim 1:
wherein, in response to the POR_state signal transitioning from POR_active to POR_inactive, the POR transition detect circuit switches the POR_transition signal from active to inactive; and
wherein, in response to the POR_transition signal switching to inactive, the POR transition control circuit is configured to initiate a POR out-of-reset delay period, and to provide the POR_state signal as POR_inactive after the POR out-of-reset delay period.

3. The circuit of claim 1, wherein the Vtp_threshold voltage corresponds to a voltage across the third resistor, and the Vtn_threshold voltage corresponds to a combination of voltages across the second resistor and the third resistor.

4. The circuit of claim 1, wherein the POR transition detect circuit is configured to provide the POR_transition signal responsive to a function max(Vtp_threshold voltage, Vtn_threshold voltage).

5. The circuit of claim 4, wherein the PMOS transistor is controlled by the Vtp_threshold voltage, and the first NMOS transistor is controlled by the Vtn_threshold voltage.

6. The circuit of claim 2, wherein a time for transition of the POR_state signal from POR_inactive to POR_active is substantially less than a time for transition of the POR_state signal from POR_active to POR_inactive.

7. An integrated circuit, comprising:
a CMOS logic block that includes PMOS transistors with a threshold voltage Vtp and NMOS transistors with a threshold voltage Vtn, the CMOS logic block coupled to a power supply input having a voltage Vdd;
a power-on-reset (POR) circuit coupled to the CMOS logic block, the POR circuit including:
  a POR state signal corresponding to a reset state for the CMOS logic block, including a POR_active state and a POR_inactive state;
  VT threshold circuitry having an input coupled to the power supply input configured to provide a Vtp threshold voltage (Vtp_threshold) based on Vdd and Vtp, and a Vtn threshold voltage (Vtn_threshold) based on Vdd and Vtn;
  POR transition detect circuitry coupled to the VT threshold circuitry to provide a POR_transition signal to a common terminal to selectively couple or decouple the common terminal from ground, based on Vtp_threshold and Vtn_threshold, the POR_transition signal including a POR transition out-of-reset state corresponding to a transition from the POR_active state to the POR_inactive state based on a function [Vdd>max(Vtp_threshold, Vtn_threshold)]; and
  POR transition control circuitry coupled to the POR transition detect circuitry to provide the POR_state signal based on the POR_transition signal, the POR transition control circuitry including:
    a delay circuit including:
      a resistor coupled between a charging voltage and the common terminal, and a delay capacitor coupled between the common terminal and ground,
    the delay circuit responsive to the POR_transition signal in the POR transition out-of-reset state, the POR_transition signal decoupling the common terminal from ground, to charge the delay capacitor through the resistor to generate the POR_state signal in the POR_inactive state, after a pre-defined POR out-of-reset delay period based on charging the delay capacitor.

8. The integrated circuit of claim 7, wherein the VT threshold circuit includes:
a scaling circuit including a voltage divider having a first resistor with a first lead coupled to the power supply input, a second resistor having a first lead coupled to a second lead of the first resistor, and a third resistor having a first lead coupled to a second resistor and a second lead coupled to the power supply voltage terminal,
the Vtp_threshold voltage corresponding to a voltage at a terminal connecting the second resistor to the third resistor, and
the Vtn_threshold voltage corresponding to a voltage at a terminal connecting the first resistor to the second resistor.

9. The integrated circuit of claim 7, wherein:
the POR transition detect circuitry is configured to provide the POR_transition signal based on a POR transition into-reset state corresponding to a transition from the POR_active state to the POR_inactive state based on Vdd<Vtp_threshold, or Vdd<Vtn_threshold.

10. The integrated circuit of claim 9, wherein the POR transition detect circuit includes:
a Vt detect circuit, including
  a replica PMOS transistor controlled by the Vtp_threshold voltage; and
  a replica NMOS transistor controlled by the Vtn_threshold voltage.

11. The integrated circuit of claim 10, wherein the POR transition detect circuit further includes:
a first NMOS transistor coupled between the common terminal and ground, controlled based on the Vtp_threshold voltage;
a second NMOS transistor coupled between the common terminal and ground, controlled based on the Vtn_threshold voltage;
such that when both the first and second NMOS transistors are off, the common terminal is decoupled from ground, and when at least one of the first and second NMOS transistors is on, the common terminal is coupled to ground.

12. The integrated circuit of claim 7, wherein the transition control circuitry includes a Schmitt trigger having an input coupled to the delay capacitor, the Schmitt trigger configured to output the POR_state signal.

13. The integrated circuit of claim 7, wherein, for a POR transition into-reset state of the POR_state signal transitions from the POR_inactive state to the POR_active state,
the POR transition detect circuit is configured to generate the POR transition into-reset state, and
the POR transition control circuit is configured to, in response to the POR transition into-reset state, switch the POR_state signal from the POR_inactive state to the POR_active state during an into-reset transition period that is substantially shorter than the POR out-of-reset delay period.

14. The circuit of claim 7, further comprising:
a POR output circuit coupled to the POR transition control circuit to output the POR_state signal to the CMOS logic block, wherein the POR output circuit includes a pull-down resistor coupled to the POR output.

* * * * *